United States Patent
Toh et al.

(10) Patent No.: US 9,202,801 B2
(45) Date of Patent: Dec. 1, 2015

(54) THIN SUBSTRATE AND MOLD COMPOUND HANDLING USING AN ELECTROSTATIC-CHUCKING CARRIER

(71) Applicants: Chin Hock Toh, Singapore (SG); Uday Mahajan, Singapore (SG); Aksel Kitowski, Singapore (SG)

(72) Inventors: Chin Hock Toh, Singapore (SG); Uday Mahajan, Singapore (SG); Aksel Kitowski, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 45 days.

(21) Appl. No.: 14/083,338

(22) Filed: Nov. 18, 2013

(65) Prior Publication Data

US 2015/0137383 A1    May 21, 2015

(51) Int. Cl.
| | | |
|---|---|---|
| H01L 51/40 | (2006.01) | |
| H01L 23/00 | (2006.01) | |
| H01L 23/48 | (2006.01) | |
| H01L 21/78 | (2006.01) | |
| H01L 21/768 | (2006.01) | |
| H01L 21/56 | (2006.01) | |
| H01L 21/683 | (2006.01) | |
| H01L 23/31 | (2006.01) | |

(52) U.S. Cl.
CPC .............. *H01L 24/94* (2013.01); *H01L 21/561* (2013.01); *H01L 21/568* (2013.01); *H01L 21/6835* (2013.01); *H01L 21/76898* (2013.01); *H01L 21/78* (2013.01); *H01L 23/481* (2013.01); *H01L 21/6831* (2013.01); *H01L 23/3128* (2013.01); *H01L 2221/68327* (2013.01)

(58) Field of Classification Search
CPC ..................... H01L 21/6831; H01L 21/67155; H01L 21/67703; H01L 23/53295; H01L 2924/002; H01L 2924/00; H01L 21/78; H01L 21/6835
USPC .................... 257/686, E33.012, 549, E21.09, 257/E21.091, E21.92, E21.097; 483/74, 483/109; 438/74, 109
See application file for complete search history.

(56) References Cited

U.S. PATENT DOCUMENTS

| | | | |
|---|---|---|---|
| 8,912,075 B1* | 12/2014 | Lei ....................... | H01L 21/6836 257/620 |
| 2003/0068891 A1* | 4/2003 | Bang ................. | H01L 21/02008 438/689 |
| 2005/0248018 A1* | 11/2005 | Morkner ....................... | 257/686 |
| 2006/0046269 A1* | 3/2006 | Thompson ........... | B01J 19/0046 435/7.1 |
| 2007/0111519 A1* | 5/2007 | Lubomirsky ........ | C23C 18/1653 438/678 |
| 2009/0130821 A1* | 5/2009 | Cox ....................... | H01L 23/544 438/455 |
| 2011/0026187 A1* | 2/2011 | Reynolds ....................... | 361/234 |
| 2011/0035937 A1* | 2/2011 | Lu et al. ........................... | 29/829 |
| 2011/0221053 A1* | 9/2011 | Chandrasekaran et al. .. | 257/686 |
| 2013/0115764 A1* | 5/2013 | Pederson .......... | H01L 21/67745 438/514 |

* cited by examiner

*Primary Examiner* — Yosef Gebreyesus

(74) *Attorney, Agent, or Firm* — Blakely, Sokoloff, Taylor & Zafman LLP

(57) ABSTRACT

Thin substrates and mold compound handling is described using an electrostatic-chucking carrier. In one example, a first part of a plurality of silicon chip packages is formed on a front side of a silicon substrate wafer at a first processing station. An a carrier wafer of an electrostatic chuck is attached over the front side of the silicon wafer. The substrate wafer is moved to a second processing station. A second part of the plurality of silicon chip packages are formed on a back side of the silicon wafer at a second processing station. The electrostatic chuck is then released.

16 Claims, 11 Drawing Sheets

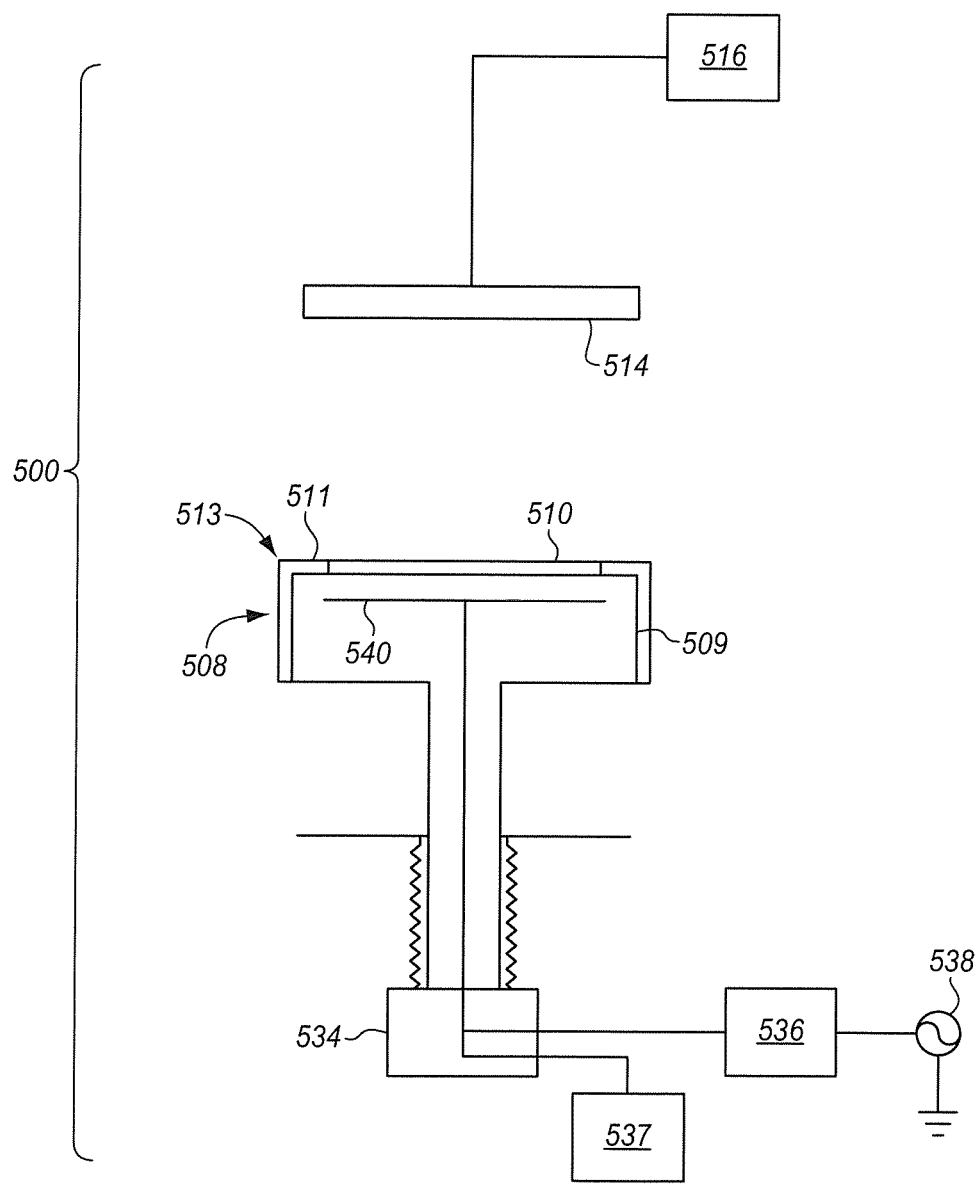

THIN SUBSTRATE AND MOLD COMPOUND HANDLING USING AN ELECTROSTATIC-CHUCKING CARRIER

FIELD

The present description relates to the field of electrostatic chucking for semiconductor wafer handling.

DISCUSSION OF RELATED ART

Semiconductor and micromechanical devices are often constructed in groups on a silicon wafer. After the wafer is fully processed, the wafer is diced into individual chips. During processing, the wafer can be moved into different chambers for exposure to various coating, etching, cleaning, and photolithography processes. As the wafers are made thinner and larger to reduce weight, size, and cost, the wafers become increasingly more difficult to handle without breaking. In addition for many of the processes, extreme temperature and chemical environments are used. As a result, carrier wafers are attached to the device wafer. The carrier wafer provides a handle by which the device wafer can be moved and held in place through fabrication processes.

More recently, dies are stacked or at least partially packaged while still together in a single wafer. This allows even small chips to be held firmly on the wafer upon which they are formed. The back side substrates of the dies stay joined together as the wafer. The connection allows many chips to be packaged at one time.

In conventional thin wafer handling and processing, an adhesive or glue is used to bond a carrier wafer to a device wafer or to a flimsy mold compound wafer. Attaching the carrier requires spin coating the adhesive to the carrier wafer, aligning the carrier wafer with the device wafer, and mounting the carrier wafer onto the device wafer. To remove the carrier wafer, baking is used together with a debonder, or release agent, and a cleaner. The process has multiple steps, requires time for the temperature cycling, and consumes glues and cleaners. More importantly, the bonding and debonding operations risk damage to the device wafer.

BRIEF DESCRIPTION OF THE DRAWINGS

Embodiments of the present invention are illustrated by way of example, and not limitation, in the figures of the accompanying drawings.

FIG. 5 is a diagram of an example of an electrostatic chuck suitable for use with the embodiments of the other figures shown in conjunction with a wafer processing chamber.

SUMMARY

Thin substrates and mold compound handling is described using an electrostatic-chucking carrier. In one example, a first part of a plurality of silicon chip packages is formed on a front side of a silicon substrate wafer at a first processing station. A carrier wafer of an electrostatic chuck is attached over the front side of the silicon wafer. The substrate wafer is moved to a second processing station. A second part of the plurality of silicon chip packages are formed on a back side of the silicon wafer at a second processing station. The electrostatic chuck is then released.

DETAILED DESCRIPTION

A carrier substrate or wafer can be attached to thin silicon substrates or to flimsy mold compound substrates using electrostatic charging forces. The thin substrate, securely held by the ESC carrier wafer, can then be processed for packaging.

A thin Si wafer, for example a wafer for TSVs (Through-Silicon Vias) can be chucked to an ESC carrier to allow chips to be stacked on the thin Si wafer. The Si wafer can be processed, dies can be attached and electrically coupled, and covers or mold compound can be placed over the dies all while the thin Si wafer is being held by the carrier wafer. In the same way, an array of dies held together in a thin and flimsy mold compound can be carried by an ESC (Electrostatic Chuck) carrier wafer. The carrier can be used to allow chips to be stacked over a thin Si wafer encapsulated by the mold compound. The carrier can also be used to allow fan-out wafer level packaging to be performed over all the dies in a single process. The particular packaging steps may be modified to suit a variety of different carrier processes.

The ESC carrier wafer is used to provide high throughput without adhesive-based thin wafer handling. 2.5D and 3D IC (Integrated Circuit) packaging can also be produced at lower cost and with less material cost.

Figure 1A:
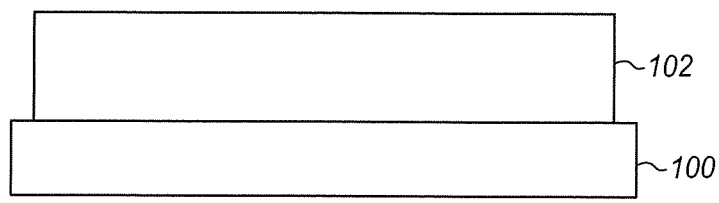
FIGS. 1A to 1I are cross-sectional diagrams of a sequence of wafer level processing stages for chucking a thinned silicon wafer to an electrostatic wafer chuck according to an embodiment of the invention.

FIGS. 1A to 1I show processing stages for producing a silicon chip package using a carrier substrate according to an embodiment of the invention. In this example, a thinned Si wafer (e.g. a TSV wafer) is chucked to an ESC carrier to enable chip stacking for a thin Si wafer flow. In FIG. 1A a silicon substrate wafer 102, sometimes called a device wafer has been attached to a carrier 100. The carrier can be a carrier chuck surface or a separate carrier wafer that is held in a chuck. The carrier wafer can be attached using an adhesive, vacuum, electrostatic forces, or in any other way. The carrier holds the silicon substrate securely through various processing stages and chambers as desired. Alternatively, the silicon substrate wafer 102 can be chucked directly without an intervening carrier wafer 100. The carrier wafer is an optional part.

Figure 1B:
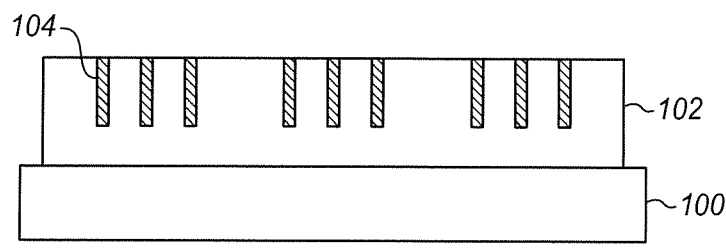

In FIG. 1B, TSVs (Through-Silicon Vias) 104 have been formed in the silicon substrate. While only three are shown for simplicity, there may be many hundreds or more, depending on the nature of the package. These can be formed by drilling and then filling with a conductive material such as copper. In addition to TSVs there can also be various redistribution layers formed in or on the silicon. While the silicon substrate 102 is carried by the carrier 100, it may be exposed to a wide variety of different processes to develop any desired electrical configuration, depending on the eventual package that is to be formed. The formation of the TSVs and any other desired structure constitutes a part of forming silicon chip packages. In the illustrated example, the first part of the package is the package substrate as shown in the subsequent package processing operations. During this processing, the side that is shown as the top side in FIG. 1B is referred to as the front side of the substrate and accordingly is also the front side of the production of the package.

Figure 1C:
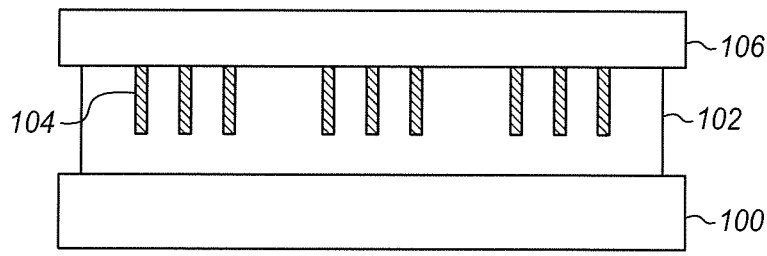

In FIG. 1C a second carrier wafer 106 is attached to the front side of the silicon substrate. The carrier wafer is the active part of an electrostatic chuck (ESC) that holds the wafer using an electric charge carried by the carrier wafer. The ESC allows the silicon substrate to be flipped to expose the back side of the silicon substrate.

Figure 1D:
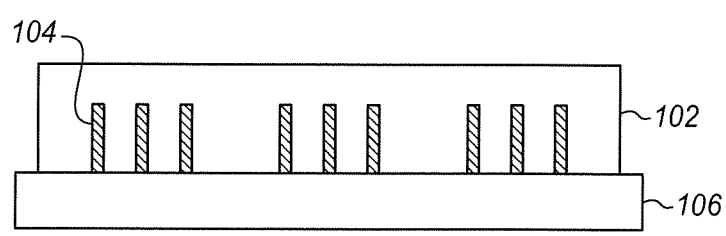

In FIG. 1D, the first carrier, if present, is removed exposing the back side of the silicon substrate. The first carrier can be removed in any of a variety of different ways depending on the nature of the first carrier. This can be by release of the vacuum, release of an electrostatic charge, debonding an adhesive or in any other suitable way. As mentioned above, the first carrier is not necessary to embodiments of the invention.

Figure 1E:
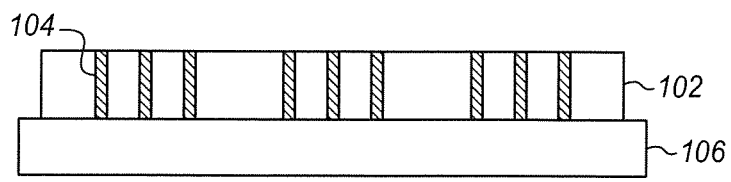

In FIG. 1E, the back side of the silicon substrate is thinned to expose the TSVs and any other desired structure on the wafer. The substrate can be thinned by CMP (Chemical Mechanical Polishing), grinding, etching or in any other way, depending on the particular implementation.

Figure 1F:
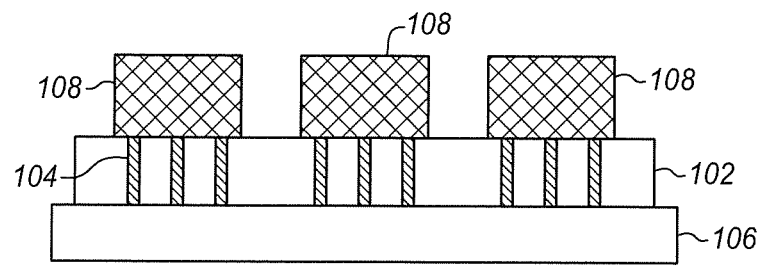
Figure 1G:
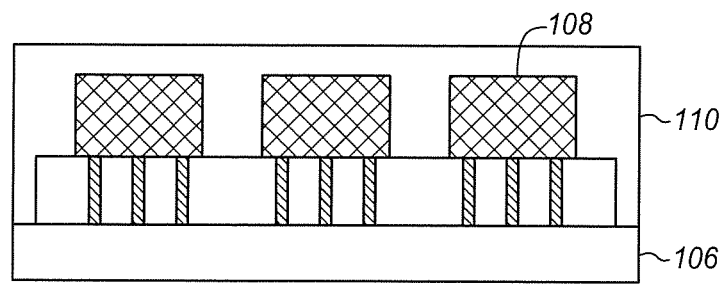

In FIG. 1F, devices 108 are attached to the silicon substrate 102. These may be any desired type of devices, analog, digital, active, or passive. In one embodiment silicon logic chips are attached to the silicon substrate. The chips have lands, bumps, or pads that electrically connect to the TSVs 104 in the substrate 102. In FIG. 1G a package cover 110 is formed or attached over the attached devices 108. The cover may be a mold compound or any other suitable cover.

Figure 1H:
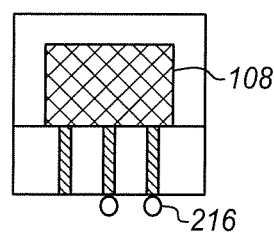

In FIG. 1H, the silicon substrate and the mold compound are dechucked by releasing the electrostatic potential on the ESC. The wafer is then diced to separate all of the silicon chips from each other into individual packages. The packages are then finished into the form of FIG. 1H. Alternatively, the silicon substrate and the mold compound are diced to separate all of the silicon chips from each other before the individual packages are dechucked and the package is finished. In the illustrated example, solder balls 216 are attached to the package substrate as an example of finishing the package, however, there may be many more operations before the package is finished. Connection arrays or systems other than solder balls may be used, depending on the particular implementation.

Figure 1I:
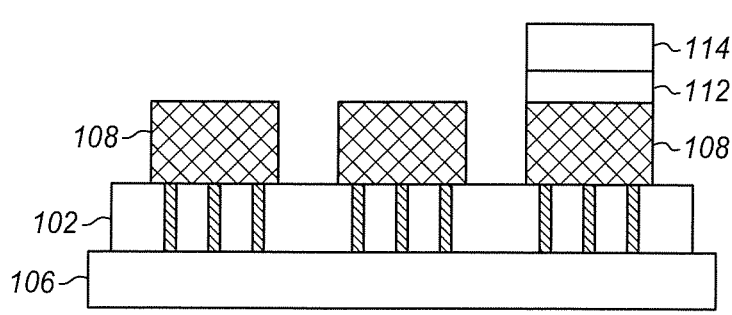

FIG. 1I shows that other operations can also be performed on the packages before the packages are diced and finished. In this example, a routing layer 112 is applied above at least one attached device 108. The routing layer can be formed in another process and attached directly to the device or it can be formed partially or completely over the attached lower chip 112. The chips are held securely by the silicon substrate 102 and the ESC 106 so that the complete assembly can be moved to different processing chambers for any of a variety of operations. A second device 114 is then stacked over the first device 108 for a stacked die package. One or more dies may be stacked over the first die, depending on the final configuration.

The partially completed package can then be diced and finished as suggested in FIG. 1H. Accordingly, the final package can have one or more chips side-by-side and one or more stacked chips. All of the intermediate routing layers can be formed using the ESC to carry and move the silicon substrate. In addition, all of the chip attach processes can be performed using the ESC to carry and move the silicon substrate.

Figure 2A:
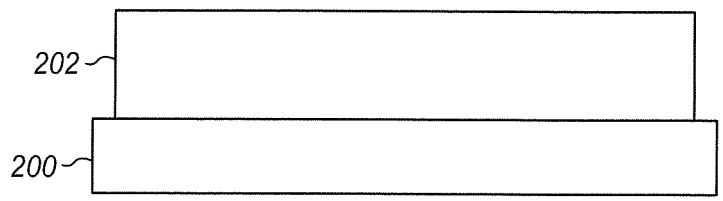
FIGS. 2A to 2H are alternative cross-sectional diagrams of a sequence of wafer level processing stages for chucking mold compound on a wafer to an electrostatic wafer chuck according to an embodiment of the invention.
Figure 2B:
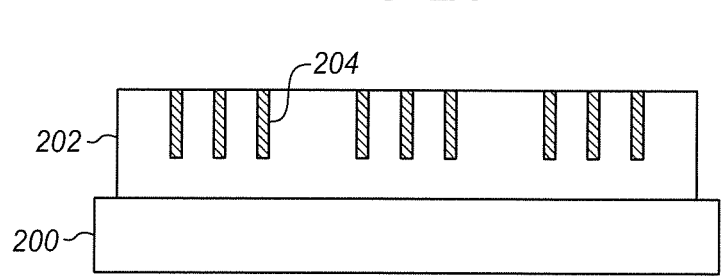

FIGS. 2A to 2H show alternative processing stages for producing a silicon chip package using a carrier substrate according to another embodiment of the invention. In this example, a thin and flimsy mold compound wafer can be chucked to an ESC (Electrostatic Chuck) carrier to enable chip stacking on thin Si. The thin Si wafer can be encapsulated with mold compound. In FIG. 2A a silicon substrate wafer or device wafer 202 has been attached to a carrier 200. This silicon or other type of substrate may be the same as or different from the substrate 102 of FIG. 1A. As in FIG. 1A, the carrier wafer 200 is optional. In FIG. 2A TSVs 204 are formed in the substrate 202.

Figure 2C:
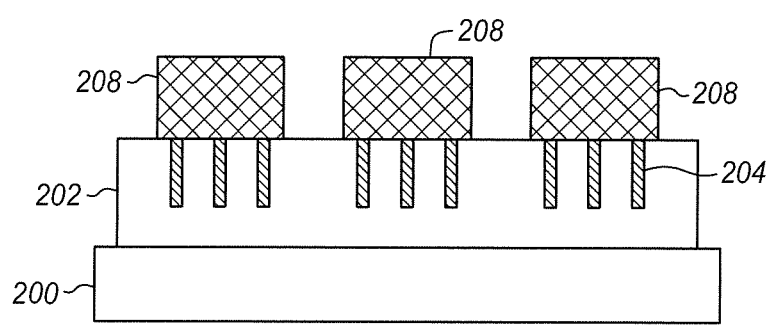
Figure 2D:
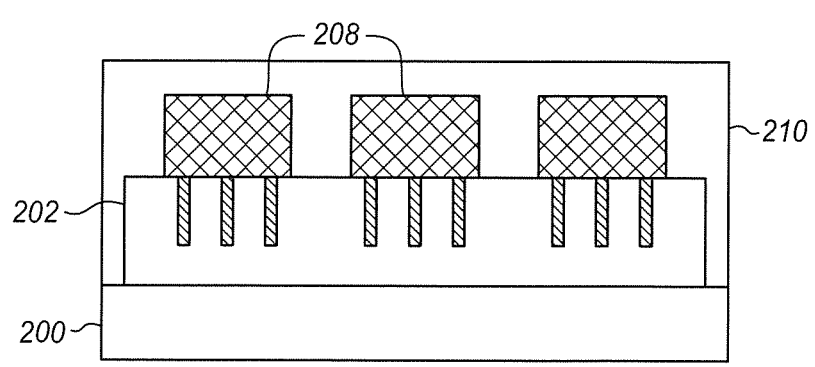

In FIG. 2C devices 208 are attached over the silicon substrate. These devices may be any of the types of devices discussed above, depending on the type of package to be formed. In FIG. 2D, a mold compound 210 is attached over the devices 208. This then completes the first part of forming the silicon chip packages. Additional devices, additional routing layers, and other operations can also be performed during this first part of forming the packages, depending on the particular implementation.

Figure 2E:
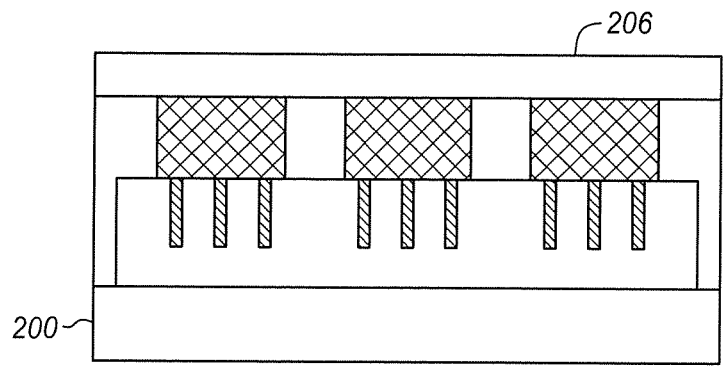

In FIG. 2E, the tops of the partially formed packages are leveled off by removing any excess mold compound and any excess device substrate. A carrier 206 for an ESC chuck is then attached to the top of the partially formed packages. As in the example of Figure 1C, the carrier wafer 206 is attached opposite the first carrier 200. The processing for the first part of forming the package has been on the front side of the silicon substrate and the carrier wafer 206 attaches to this same side. While in the example of Figure 1C, the carrier wafer was attached to the silicon substrate, in the example of FIG. 2E, the carrier wafer attaches to the back side of the attached devices 208 and to the mold compound 210.

Figure 2F:
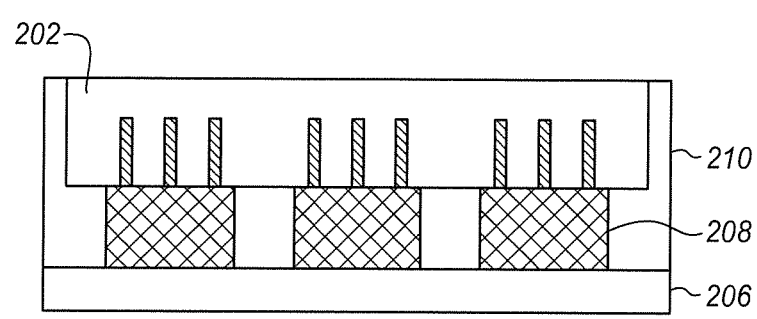
Figure 2G:
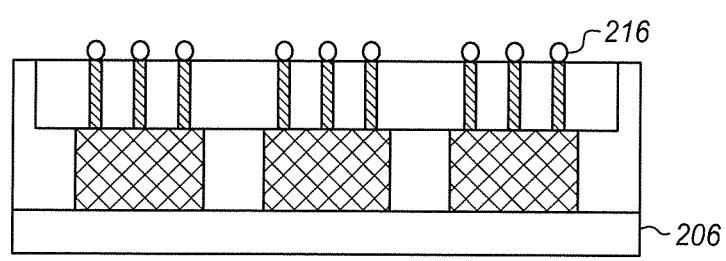

In FIG. 2F, the first carrier, if present, is removed and the silicon substrate is flipped, exposing the back side of the substrate. The second part of fabricating the packages can now be performed. In FIG. 2G, the back side of the substrate is polished or ground off to expose the TSVs. Solder ball 216 attach is also performed over the exposed TSVs. These operations are provided as examples, any of a variety of different operations may be performed on the back side of the substrate. Pads may be formed. Additional routing layers may be formed and additional and other types of contact and attachment structures may be formed.

Figure 2H:
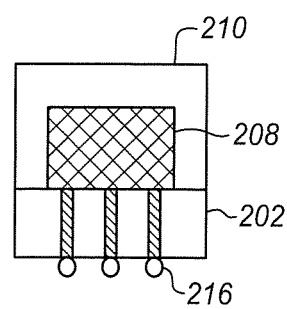

In FIG. 2H, the silicon substrate and the mold compound are released from the ESC carrier. The wafer is then diced into separate packages, each with attached devices, and each package is finished as desired depending on the particular implementation. Alternatively, the silicon substrate and the mold compound are diced into separate packages and then released from the ESC carrier. In the illustrated example, additional mold compound 210 is applied to cover all of the attached chip 208. While the finished package is shown with only one chip, additional chips and other devices may be attached while the chips are carried in the ESC chuck, to form a variety of different types of packages.

Figure 3A:
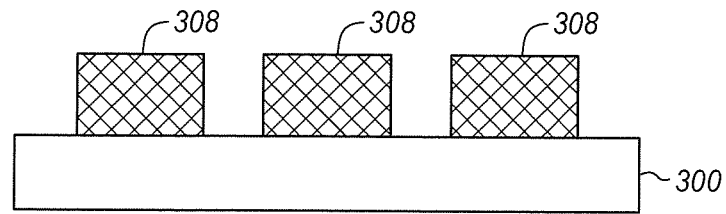
FIGS. 3A to 3G are alternative cross-sectional diagrams of a sequence of wafer level processing stages for chucking a thinned silicon wafer for fan-out packaging to an electrostatic wafer chuck according to an embodiment of the invention.

FIGS. 3A to 3G show other alternative processing stages for producing a silicon chip package using a carrier substrate according to another embodiment of the invention. In this example, a thin and flimsy mold compound can be wafer chucked to an ESC carrier for fan-out wafer level packaging. In FIG. 3A, devices 308, such as silicon chips are attached to a carrier wafer 300. These may be glued, soldered, or attached in any other way, depending on the equipment being used. As in the other examples, the devices are fabricated in another process, not shown, and attached after being completed. As in the other examples, the front sides of the dies are attached to the substrate.

Figure 3B:
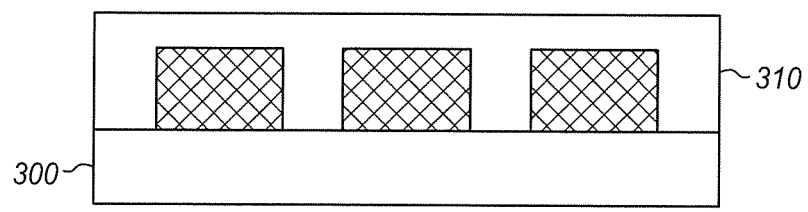
Figure 3C:
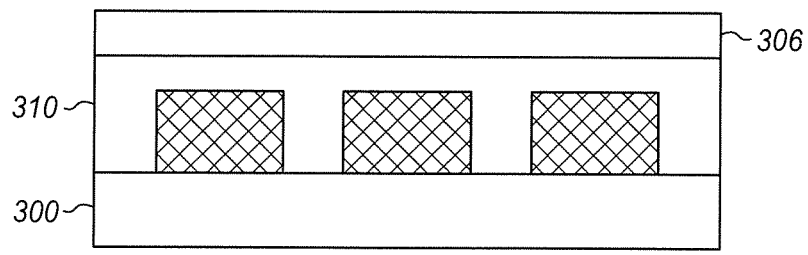

In FIG. 3B a cover 310, such as mold compound is formed over the dies. In FIG. 3C a carrier wafer 306 of an ESC is attached to the mold compound. In the example of FIG. 2F, the ESC is in contact with the back sides of the devices. The partially finished packages are carried by the structure of the devices and the mold compound. In this example, the ESC is near but not touching the back sides of the dies. The mold compound is used to carry the devices as the packages are formed. In both examples, the mold compound may be leveled as in FIG. 2E or it may completely cover the devices as in FIG. 3C.

Figure 3D:
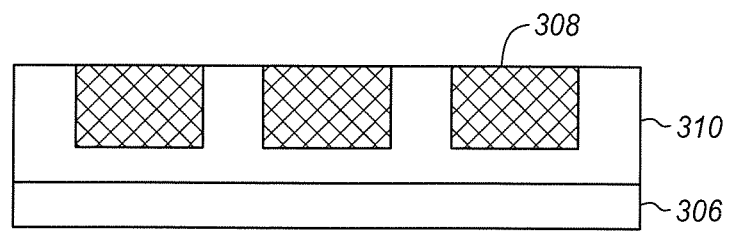

In FIG. 3D the original carrier is removed exposing the front sides of the dies and the dies are flipped for the next part of assembling the packages. The entire wafer size assembly, which includes many dies, is carried by the ESC. In contrast to FIG. 2F, there is no silicon substrate and there are no TSVs.

Figure 3E:
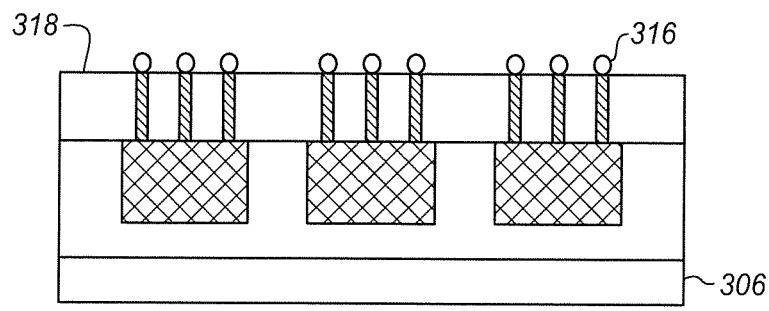

In FIG. 3E a distribution layer 318 is formed over the dies. This may be done using photolithography, deposition or any other technique. Alternatively, a substrate formed in a separate process may be attached across the mold compound and all of the devices. Any additional operations may also be performed as represented by the solder balls 316 attached to the redistribution layer.

Figure 3F:
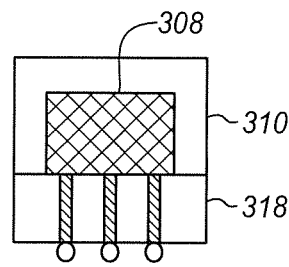
Figure 3G:
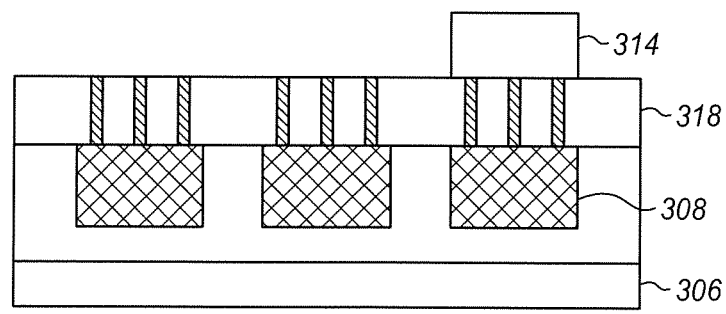

In FIG. 3F, the packages have been diced and released from the ESC. Any additional processes are performed to finish the packages. FIG. 3F shows that this process may also be used for stacked dies by stacking devices 314 over the redistribution layer 318. Additional redistribution layers and devices may be added to the stack as desired, depending on the particular final configuration that is being produced.

While several stages are shown for each fabrication process, these stages are not all required and many other and additional stages may be used. Operations shown in one of the processes may be adapted for use in another one of the processes.

Figure 4A:
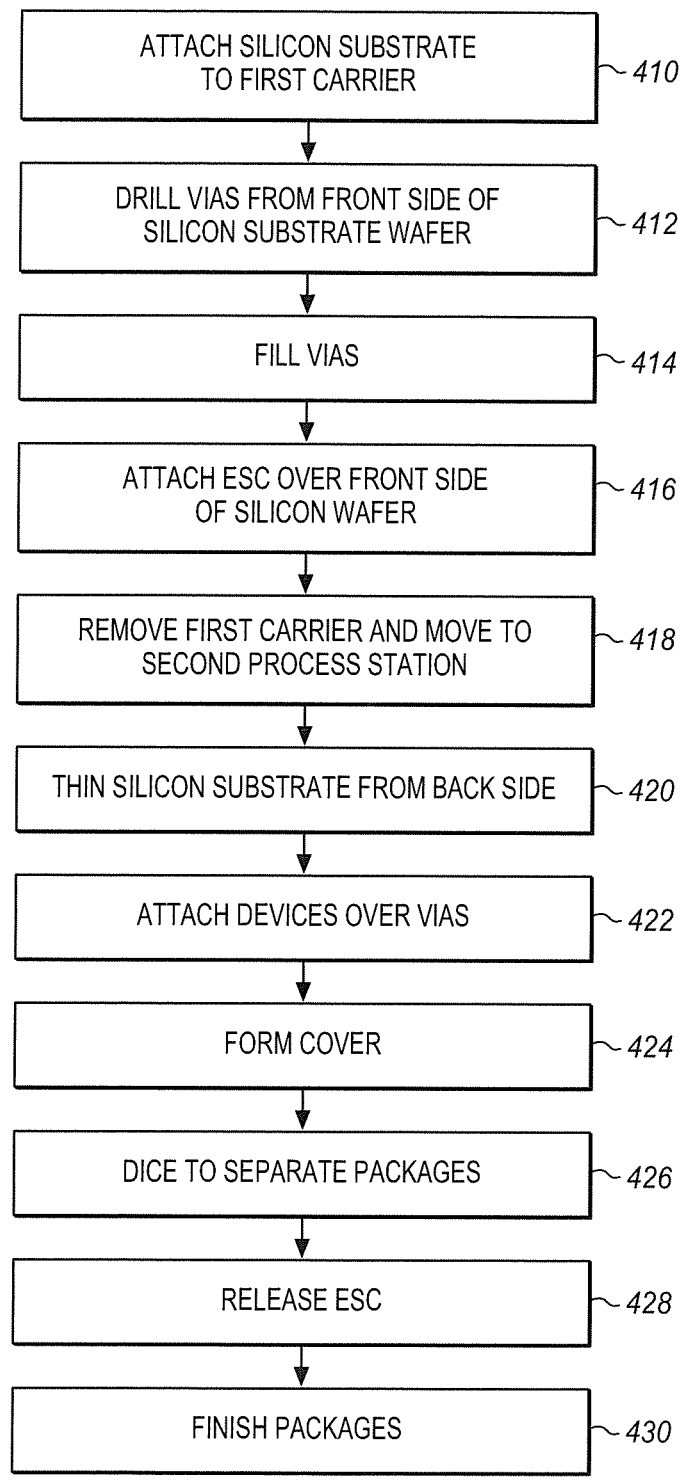
FIG. 4A is a process flow diagram corresponding to the embodiments of the invention shown in FIGS. 1A to 1I.

The processes described above, may alternatively be illustrated by way of process flow diagrams. FIG. 4A is a process flow diagram corresponding to the example of FIGS. 1A to 1H. In FIG. 4A at 410, a silicon substrate is attached to a first carrier wafer. This may be done in any of a variety of different ways as mentioned above.

A first part of the operations of FIG. 4A are performed on the front side of the silicon substrate before the ESC (Electrostatic Chuck) is attached. At 412, vias are drilled from the front side of silicon substrate wafer through at least a portion of the silicon substrate wafer at a first process station. At 414 the vias are filled with a conductive material, typically this is copper but other materials may alternatively be used.

The next part of the operations are performed on the back side of the silicon substrate after the ESC is attached. At 416, a carrier wafer of an electrostatic chuck (ESC) is attached over the front side of the silicon wafer. The ESC is attached by moving it into contact with the silicon substrate and then energizing the electrostatic charge. The first carrier can then be removed at 418 and the silicon substrate moved to any desired location or station for further processing.

At 420 the silicon substrate is thinned from the back side to expose the vias that were made previously. At 422, devices are attached over the vias to connect the devices to the vias. Typically, but not necessarily, the devices are silicon chips that have been formed separately in a different process. At 424, a cover, such as mold compound is formed over the attached devices. More devices may be attached before the cover is formed with redistribution layers or other connections to form stacked or side-by-side die configurations.

At 426 the silicon substrate wafer and the mold compound is diced to separate all of the silicon chip packages from each other and at 428 the ESC is released. The packages are finished at 430.

Figure 4B:
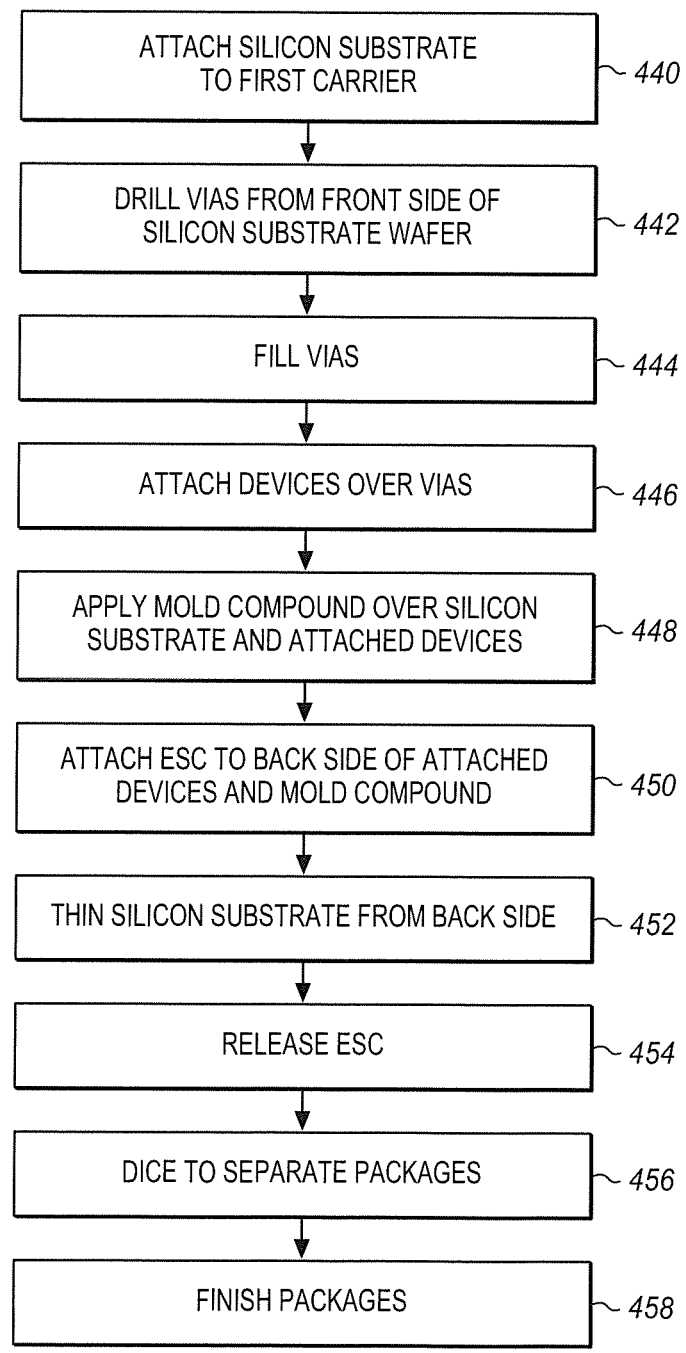
FIG. 4B is a process flow diagram corresponding to embodiments of the invention shown in FIGS. 2A to 2H.

FIG. 4B is a process flow diagram corresponding to the example of FIGS. 2A to 2H. In FIG. 4B at 440, a silicon substrate is attached to a first carrier wafer. At 442 vias are drilled from the front side of the silicon substrate wafer and at 444, the vias are filled with conductive material. Additional processes may be performed to create redistribution layers, fan-out layers, connection pads or lands, or other structures on the front side of the substrate, depending on the intended use of the device.

At 446, devices, such as finished silicon chips are attached over the vias or other structures and at 448 mold compound is applied over the silicon substrate and the attached devices. This completes the first part of the package processing. At 450, the ESC is attached over the mold compound and over the attached devices. The assembly may then be moved as desired using the ESC.

In the second part of the processing, the first carrier is removed and the silicon substrate is thinned at 452 from the back side. This exposes the other side of the vias. Additional structures may also be formed over the back side of the substrate, such as redistribution and fan-out layers, lands and pads.

At 452 the ESC is released. At 456, the assembly is diced into separate packages and at 458 the silicon chip packages are finished. Finishing may include additional mold compound or covers, attaching additional devices, applying solder paste or balls or other operations. As with the example of FIG. 4A, additional devices may be attached over the devices attached at 446 for stacked die configurations.

Figure 4C:
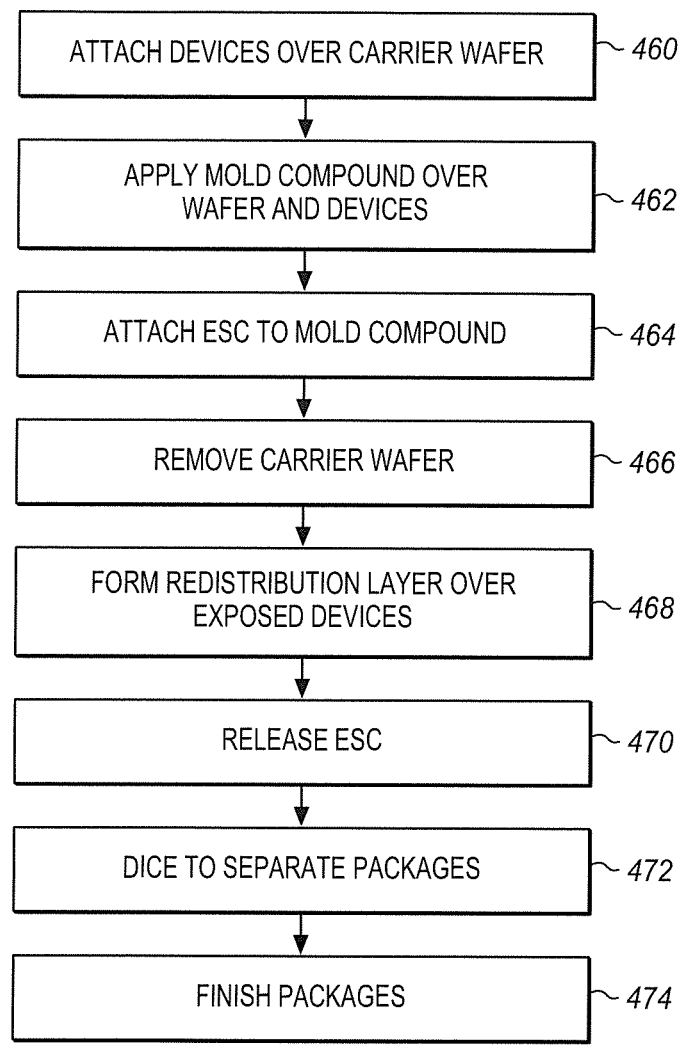
FIG. 4C is a generalized process flow diagram of alternative embodiments of the invention.

FIG. 4C is a process flow diagram corresponding to the example of FIGS. 3A to 3F. In FIG. 4C at 460 devices, such as silicon chips are attached over a carrier wafer. The carrier wafer is typically but not necessarily a silicon substrate, however, other materials may be used instead. At 462 a mold compound is applied over the carrier wafer and the attached devices. The first part of the package assembly is finished and the assembly can be flipped so that the front side of the attached chips can be accessed.

At 464 the ESC is attached over the mold compound. In the illustrated example, the mold compound covers the silicon chips so that the ESC is attached to the mold compound, however, the mold compound may be thinned or applied in a thinner layer to expose the back sides of the chips. The ESC may then attach to both the back sides of the chips and the mold compound. The first carrier wafer is removed at 466 exposing the front sides of the attached devices.

At 468 the second part of the package assembly is started. In this example, redistribution layers are formed over the exposed attached devices. At 470 the ESC is released after completion of the second part of the package processing. At 472 the redistribution layer and mold compound are diced to separate the silicon chips into separate packages and at 474 the silicon chip packages are finished. Each package may contain only one chip or each package may contain multiple chips. The chips connect to external components through the redistribution layer.

Figure 4D:
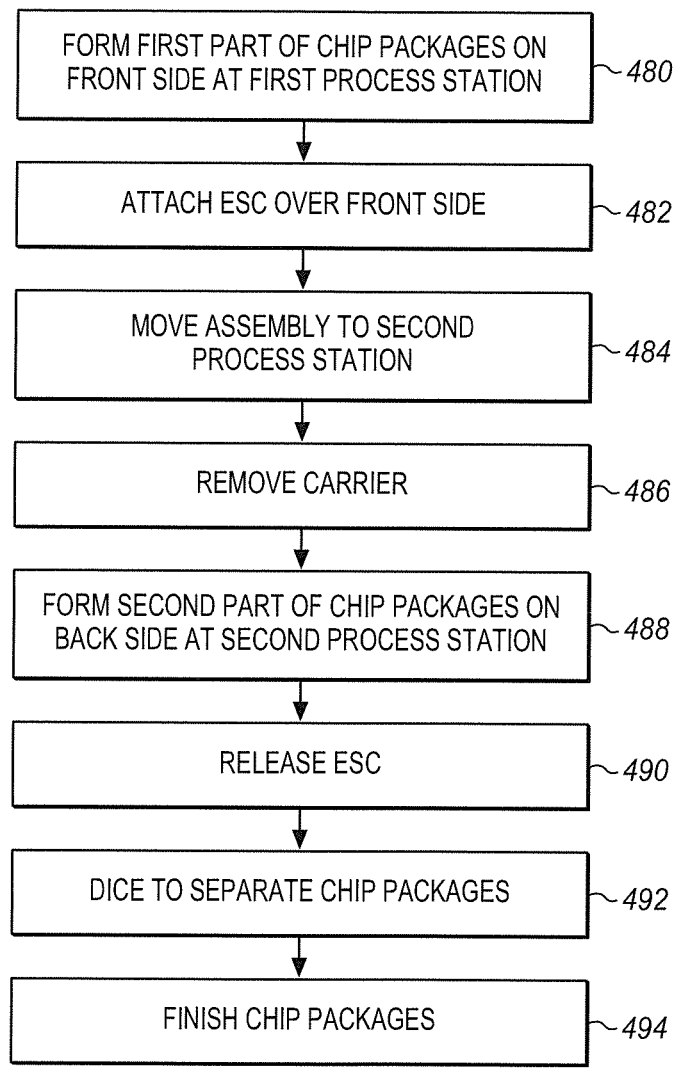
FIG. 4D is a generalized process flow diagram of handling a thin substrate and mold compound according to an embodiment of the invention.

FIG. 4D is a generalized process flow diagram of the operations that are performed in each of the examples provided above. At 480 a first part of a plurality of packages, such as silicon chip packages, are formed on the front side of the packages at a first process station. The processes may be performed on a silicon substrate or only on chips that are attached to a carrier wafer without a separate silicon substrate. The processes may include applying package covers or mold compound as well as forming redistribution layer and multiple chip configurations.

At 482 a carrier wafer of an electrostatic chuck is attached over the front sides of the packages. This may be the front side of a silicon substrate that has been processed or the front side of a carrier wafer. At 484, the entire assembly which may include a substrate wafer, various chips, or just a silicon substrate may be moved to a second process station using the attached ESC. At 486, the original carrier may be removed. This may be done before or after moving the assembly, depending upon how the original carrier is attached and the nature of the processes available at the first station.

At 488 the second part of the chip packages is formed on the back side at a second process station. This may be the back side of a silicon substrate wafer that has TSVs, redistribution or fan-out layers or it may be the back sides of the packages. In the example of FIG. 4C, the back side corresponds to the front side of the attached devices and the back side of the carrier wafer that has been removed. The processing may include attaching chips, forming redistribution layers, thinning the substrate and other operations.

At 490 the ESC is released. At 492 the assembly is diced to separate it into a plurality of silicon chip packages and at 492 the packages are finished. The dicing may be through a silicon substrate, a mold compound, a redistribution layer or any combination of such structures.

FIG. 5 is a diagram of an example of an electrostatic chuck suitable for use with the example above in conjunction with a wafer processing station. The process station 500 may comprise a substrate support 508 comprising an electrostatic chuck 509 for retaining a substrate 510. Other types of process stations having different configurations and more or less equipment than provided in this example may be used as an alternative to that shown here.

The process station 500 includes an optional showerhead 514 or other type of nozzles provided at any desired location. The gas inlet, such as the showerhead 514, is coupled to a gas supply 516 for providing process gases. The substrate support 508 may be coupled to a lift mechanism 534 or a simpler stand. The process position is selected to maximize process uniformity for a particular process step.

In some embodiments, the substrate support 508 may include a process kit 513 with an edge ring 511 at the top of the substrate support 508. The edge ring 511 secures the substrate 510 for processing and protects the underlying substrate support 508 from damage during processing.

The substrate support 508 includes an electrostatic chuck (ESC) 509 to retain and support the substrate 510 on the surface of the substrate support 508. The ESC includes an electrode 540. coupled to a chucking power source 537, such as a DC or AC power supply. The electrode 540 is also or alternatively coupled to a bias power source 538 through a matching network 536. The electrode 540 may be embedded in a portion of the electrostatic chuck 509. For example, the electrostatic chuck 509 may have a dielectric plate to support the substrate. The dielectric plate may be in the form of a disc, or puck or any suitable shape corresponding to the shape of the substrate.

In some embodiments, a mobile or wireless ESC carrier is used to chuck to the device wafer. Accordingly, upon chucking the mobile ESC carrier to the device wafer, the two bonded wafer pair may be processed inside the chamber. Inside the chamber, the bonded wafer pair may be placed on a heater or ESC chucked to the pedestal.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" and "connected" along with their derivatives, may be used. "Coupled" is used to indicate that two or more elements co-operate or interact with each other, but they may or may not have intervening physical or electrical components between them.

In the following description and claims, the terms "chip" and "die" are used interchangeably to refer to any type of microelectronic, micromechanical, analog, or hybrid small device that is suitable for packaging and use in a computing device.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

What is claimed is:

1. A method comprising:
    forming a first part of each of a plurality of silicon chip packages on a front side of a silicon substrate wafer at a first processing station;
    attaching a carrier wafer of an electrostatic chuck over the front side of the silicon wafer;
    moving the substrate wafer to a second processing station;
    forming a second part of each of the plurality of silicon chip packages on a back side of the silicon wafer at a second processing station; and
    releasing the electrostatic chuck.

2. The method of claim 1, further comprising:
    dicing the substrate wafer to separate the plurality of silicon chip packages; and
    finishing the plurality of silicon chip packages.

3. The method of claim 1:
    wherein forming the first part comprises drilling vias from the front side of the silicon substrate wafer through at least a portion of the silicon substrate wafer, and filling the vias with a conductive material; and
    wherein forming the second part comprises thinning the silicon substrate from the back side of the silicon substrate wafer to expose the vias and attaching devices over the vias to connect to the vias.

4. The method of claim 3, wherein attaching devices comprises attaching each one of a plurality of silicon chips formed in a different process.

5. The method of claim 4, further comprising forming redistribution layers over the vias of the silicon substrate before attaching devices and wherein attaching devices comprises attaching each one of the plurality of silicon chips over the redistribution layers.

6. The method of claim 5, further comprising dicing the substrate wafer after attaching each one of the plurality of silicon chips to separate the chips and finishing the plurality of silicon chip packages, each package containing at least one of the plurality of chips.

7. The method of claim 1, wherein forming the first part comprises:
   drilling vias from the front side of the silicon substrate wafer through at least a portion of the silicon substrate wafer;
   filling the vias with a conductive material;
   attaching devices over the vias to connect to the vias; and
   applying a mold compound over the silicon substrate and the attached devices,
   wherein attaching the carrier wafer comprises attaching the carrier wafer to the mold compound.

8. The method of claim 7, wherein forming the second part comprises thinning the silicon substrate from the back side of the silicon substrate wafer to expose the vias and attaching devices over the vias to connect to the vias.

9. The method of claim 7, wherein forming the second part comprises thinning the silicon substrate wafer from the back side of the silicon substrate wafer to expose the vias and forming redistribution layers over the vias of the silicon substrate.

10. The method of claim 1, wherein forming the first part comprises:
    attaching devices over the substrate wafer; and
    applying a mold compound over the silicon substrate wafer and the attached devices, and
    wherein attaching the carrier wafer comprises attaching the carrier wafer to the mold compound.

11. The method of Claim 10, wherein forming the second part comprises removing the carrier wafer that is attached to the mold compound from over the mold compound and the attached devices to expose the attached devices and forming a redistribution layer over the exposed attached devices.

12. The method of claim 11, further comprising dicing the redistribution layer and the mold compound to separate the devices into the plurality of silicon chip packages.

13. A silicon chip package formed by:
    forming a first part of a plurality of silicon chip packages on a front side of a silicon substrate wafer at a first processing station;
    attaching a carrier wafer of an electrostatic chuck over the front side of the silicon wafer;
    moving the silicon substrate wafer to a second processing station;
    forming a second part of the plurality of silicon chip packages on a back side of the silicon substrate wafer at a second processing station;
    releasing the electrostatic chuck;
    dicing the silicon substrate wafer to separate a silicon chip package from the plurality of silicon chip packages; and
    finishing the separated chip package.

14. The package of claim 13 wherein the separated silicon chip package is further formed by:
    forming vias in the silicon substrate wafer;
    forming redistribution layers over the vias;
    attaching additional silicon chips over the redistribution layers before dicing the substrate wafer.

15. The package of claim 13, wherein the separated silicon chip package is further formed by:
    attaching additional silicon chips over the substrate wafer; and
    applying a mold compound over the silicon substrate wafer and the attached silicon chips;
    wherein attaching the carrier wafer comprises attaching the carrier wafer to the mold compound.

16. The package of claim 15, where forming the second part comprises thinning the silicon substrate wafer from the back side of the silicon substrate wafer to expose the vias and attaching additional silicon chips over the vias to connect to the vias.

* * * * *